United States Patent
Taubert et al.

(10) Patent No.: US 11,581,668 B2
(45) Date of Patent: Feb. 14, 2023

(54) BATTERY CONNECTION DEVICE

(71) Applicant: Vitesco Technologies GmbH, Hannover (DE)

(72) Inventors: Sebastian Taubert, Munich (DE); Sorin Andrei, Munich (DE); Eduard Iosif Trif, Munich (DE); Jens Reiter, Munich (DE); Thomas Schmid, Munich (DE)

(73) Assignee: Vitesco Technologies GmbH

( * ) Notice: Subject to any disclaimer, the term of this patent is extended or adjusted under 35 U.S.C. 154(b) by 0 days.

(21) Appl. No.: 17/490,140

(22) Filed: Sep. 30, 2021

(65) Prior Publication Data

US 2022/0131287 A1 Apr. 28, 2022

(30) Foreign Application Priority Data

Oct. 23, 2020 (EP) .................................. 20465572

(51) Int. Cl.
*H01R 11/28* (2006.01)
*H01M 50/543* (2021.01)
(Continued)

(52) U.S. Cl.
CPC ........ *H01R 11/281* (2013.01); *B60R 16/0239* (2013.01); *B60S 5/06* (2013.01);
(Continued)

(58) Field of Classification Search
CPC ............................ H01R 13/24; H01R 13/2407; H01R 13/2414; H01R 11/281; H01R 13/5202;
(Continued)

(56) References Cited

U.S. PATENT DOCUMENTS 8,734,191 B2 * 5/2014 Zhao .................. H01R 13/6456
439/701
2013/0090009 A1 4/2013 Zhao

FOREIGN PATENT DOCUMENTS

EP 2579395 A2 4/2013
WO WO-2020129338 A1 * 6/2020

OTHER PUBLICATIONS

Extended European Search Report for European Application No. 20 465 572.4, dated Mar. 15, 2021, 10 pages.

* cited by examiner

*Primary Examiner* — Abdullah A Riyami
*Assistant Examiner* — Justin M Kratt
(74) *Attorney, Agent, or Firm* — RatnerPrestia

(57) ABSTRACT

A battery connection device for connecting to a vehicle battery includes a top member, a bottom member having a side wall and a bottom wall. The side wall, top member, and bottom member form a box-like enclosure. The bottom wall includes a through-hole with a circumferential face, an adapter member arranged inside the box-like enclosure extends at least partially through the through-hole for connection with the battery. A dimension of the adapter member is smaller than a dimension of the through-hole to form a gap between an outer face of the adapter member facing the circumferential face and the circumferential face, and flexible connection member connected to the adapter member and to the bottom member and closing the gap between the outer face and the circumferential face. The flexible connection member includes an electromagnetic shield for shielding electromagnetic radiation and a seal for sealing the gap against dust and/or moisture.

10 Claims, 2 Drawing Sheets

(51) Int. Cl.
*H01R 13/52* (2006.01)
*H01R 13/6581* (2011.01)
*H01R 13/631* (2006.01)
*H01R 13/6583* (2011.01)
*B60S 5/06* (2019.01)
*H01M 50/24* (2021.01)
*H01M 50/249* (2021.01)
*H05K 9/00* (2006.01)
*B60R 16/023* (2006.01)
*H01R 13/6598* (2011.01)
*H01M 50/244* (2021.01)
*B60R 16/033* (2006.01)
*H01R 13/24* (2006.01)

(52) U.S. Cl.
CPC ......... *H01M 50/24* (2021.01); *H01M 50/249* (2021.01); *H01M 50/543* (2021.01); *H01R 13/5202* (2013.01); *H01R 13/6315* (2013.01); *H01R 13/6581* (2013.01); *H01R 13/6583* (2013.01); *H05K 9/0009* (2013.01); *H05K 9/0081* (2013.01); *B60R 16/033* (2013.01); *H01M 50/244* (2021.01); *H01M 2220/20* (2013.01); *H01R 13/24* (2013.01); *H01R 13/2407* (2013.01); *H01R 13/2414* (2013.01); *H01R 13/6598* (2013.01); *Y02E 60/10* (2013.01)

(58) Field of Classification Search
CPC ............ H01R 13/6315; H01R 13/6581; H01R 13/6583; H01R 13/6598; B60R 16/0239; B60R 16/033; B60S 5/06; H01M 50/24; H01M 50/249; H01M 50/543; H01M 50/244; H01M 2220/20; H05K 9/0009; H05K 9/0081; Y02E 60/10
See application file for complete search history.

BATTERY CONNECTION DEVICE

CROSS REFERENCE TO RELATED APPLICATIONS

This application claims priority to European Patent Application No. 20465572, filed Oct. 23, 2020, the contents of such application being incorporated by reference herein.

FIELD OF THE INVENTION

The present invention relates to a battery connection device for connecting to a battery of a vehicle.

BACKGROUND OF THE INVENTION

Nowadays, electric vehicles, plug-in hybrid electric vehicles and other type hybrid electric vehicles all include some sort of battery. These batteries need to be charged, discharged or—in a more general way—be controlled, depending on the specific task at hand. Usually, batteries are therefore connected to a kind of electronic control box, the electronic control box having all the electronics on board for communicating with and controlling of the battery.

It was found, however, that the physical connection to the battery can be challenging at times. The reason for this is that the battery usually has some kind of predefined mounting ports attached to it. These mountings ports are used to mount the electronic control box to the battery and specified by the supplier of the battery. The position of these mounting ports is, however, subject to tolerances, for example, due to manufacturing reasons. As a result, a position between these mounting ports and the actual electric ports of the battery (this is where the actual conductive connection between the electronic control box and the battery applies) may vary from one battery to another battery, depending on the actual tolerances, the manufacturing of the battery and other factors not known beforehand. As a result, the electric connection ports of the electronic control box may be subject to a high mechanical stress, resulting in a pre-mature failure of the electronic control box which is costly and time consuming to replace.

SUMMARY OF THE INVENTION

Thus, an aspect of the present invention provides a battery connection device which can be easily connected to a battery of a vehicle and at the same time minimize mechanical stress.

According to an aspect of the present invention, a battery connection device configured to be connected to a battery of a vehicle is disclosed. The battery connection device comprises a top member, a bottom member having a side wall and a bottom wall connected to the side wall, wherein the side wall is connected to the top member such that the top member and the bottom member together form a box-like enclosure. The bottom wall further includes a through-hole with a circumferential face. The battery connection device further includes an adapter member arranged inside the box-like enclosure and extending at least partially through the through-hole for connection with battery. A dimension of the adapter member is smaller than a dimension of the through-hole such that a gap is formed between an outer face of the adapter member facing the circumferential face and the circumferential face. The battery connection device further comprises a flexible connection member connected to the adapter member and to the bottom member, the flexible connection member being arranged such that it closes the gap between the outer face and the circumferential face, wherein the flexible connection member further includes an electromagnetic shielding function for shielding electromagnetic radiations and a sealing function for sealing the gap against dust and/or moisture.

An aspect of the present invention is at least partially based on the idea that the gap between the outer face and the circumferential face allows for a relative movement between the adapter member which is configured to be connected to battery ports of the battery and the bottom member which is configured to be connected to mounting ports of the battery. Thus, whenever there is a variation (distance wise) between the position of the battery reports and the position of the mounting ports, for example due to tolerances and/or manufacturing circumstances of the battery, this variation can be compensated by the relative movement between the adapter member and the bottom member. At the same time, the gap between the outer face and the circumferential face is closed by the flexible connection member which, according to an aspect of the present invention, includes the electromagnetic shielding function as well as the sealing function. This ensures that dust and/moisture cannot penetrate into the inside or enclosure of the battery connection device. Furthermore, the electromagnetic shielding function prevents any electromagnetic radiation from leaving the enclosure and/or entering the enclosure via the gap. Electromagnetic radiation is known to a person skilled in the art as radiated emission. The battery connection device according to an aspect of the present invention can thus be easily and reliably be connected to the battery while minimizing the stress on any mechanical connection between the battery connection device and the battery due to the gap between the outer face and the circumferential face allowing for some relative movement between the adapter member and the bottom member.

According to a preferred embodiment of the present invention, the flexible connection member includes a sealing member made of rubber material for providing the sealing function and a shielding member made of conductive material for providing the electromagnetic shielding function. This preferred embodiment is at least partially based on the idea that by splitting the flexible connection member into two separate members, one for the sealing function and the other one for the shielding function, more flexibility with respect to the design of the battery connection device is possible.

According to an even further preferred embodiment of the present invention, the sealing member and the shielding member are both connected to the bottom wall of the bottom member and to a bottom side of the adapter member. Thus, the sealing member as well as the shielding member are, at least with one end, connected to the adapter member from underneath which ensures a reliable sealing function and allows for a proper conductive connection to the battery. In a very advantageously embodiment, the shielding member protrudes from the bottom side of the adapter member towards the battery. This ensures a proper conductive contact between the shielding member and the battery.

In a further embodiment of the present invention, the sealing member and the shielding member are connected to the bottom wall using a plastic clamp. The plastic clamp is made of plastic material which allows for good enough clamping properties while being non-conductive to not hamper the electromagnetic shielding function of the shielding member.

According to a further embodiment of the present invention, the shielding member includes a stamped copper part and a braided copper part connected to the stamped copper part. Both the braided copper part and the stamped copper part ensure a sufficiently high electromagnetic shielding function. In addition, the braided copper part allows for enough flexibility to close the gap between the outer face and the circumferential face.

In a further preferred embodiment of the present invention, a first end of the stamped copper part is connected to the bottom side of the adapter member, a second end of the stamped copper part is connected to a first end of the braided copper part, and a second end of the braided copper part is connected to the bottom wall of the bottom member. In particular when the first end of the stamped copper part protrudes from the bottom side of the adapter member, a reliable electromagnetic shielding function is provided which ensures, in particular due to the flexibility of the braided copper part, that a relative movement between the adapter member and the bottom member is possible.

BRIEF DESCRIPTION OF THE DRAWINGS

Exemplary embodiments of the present invention are described by the accompanying drawings, which are incorporated herein and constitute a part of the specification. In the drawings

DETAILED DESCRIPTION OF THE PREFERRED EMBODIMENTS

Figure 1:
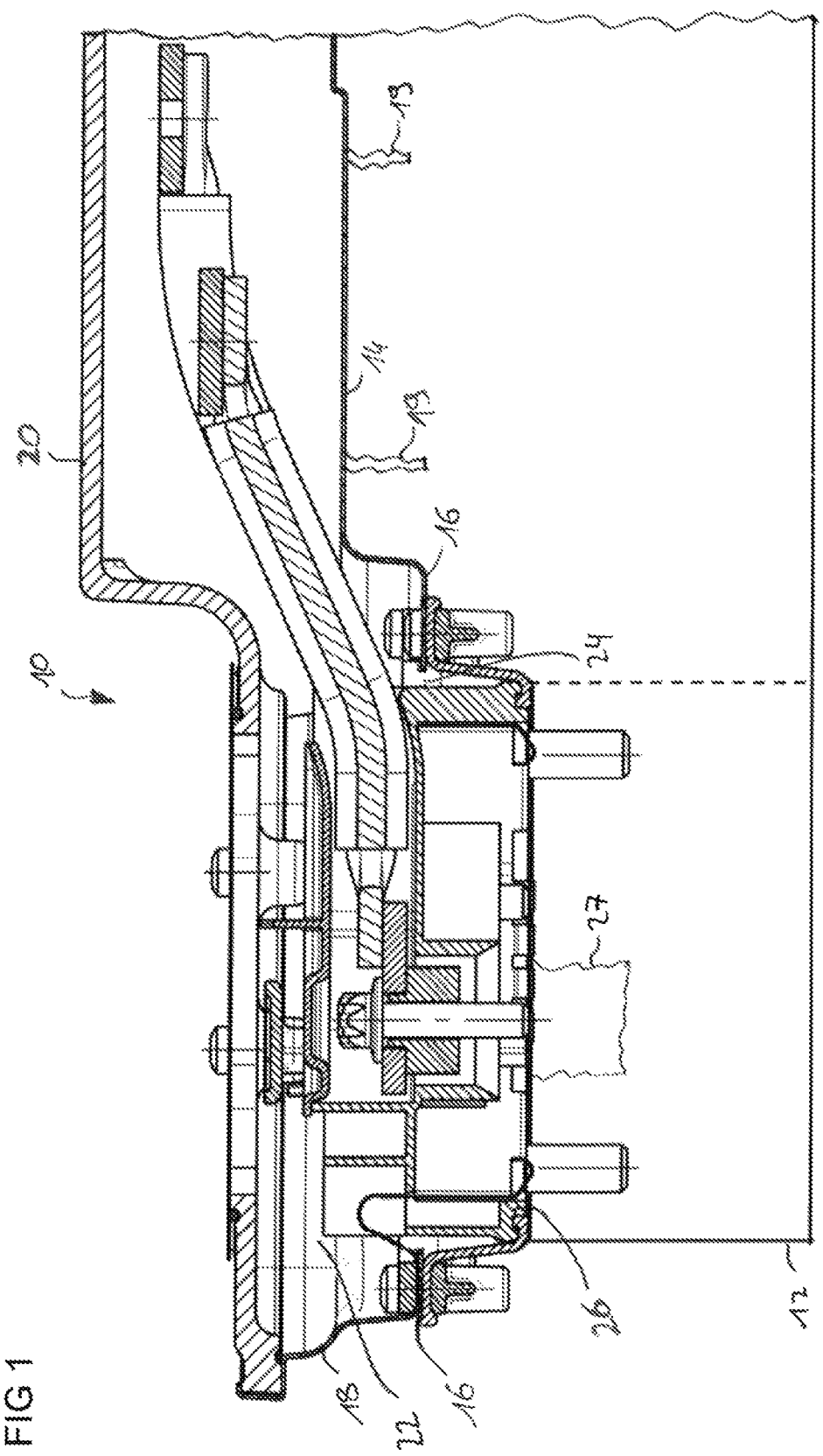
FIG. 1 is a schematic cross-sectional view of an embodiment of a battery connection device according to an aspect of the present invention.

Referring to FIG. 1, a battery connection device 10 is shown. Battery connection device 10 is configured to be connected to a battery 12 of a vehicle. Such batteries 12 are used, for example, in electric vehicles, plug-in hybrid electric vehicles or other type hybrid electric vehicles.

Battery connection device 10 includes a pot-like bottom member 14. Bottom member 14 can be made, for example, from sheet metal which is stamped and bent to arrive at the pot-like shape. Bottom member 14 includes a bottom wall 16 and a side wall 18 connected to bottom wall 16. Side wall 18 protrudes from bottom wall 16 to form the pot-like shape of bottom member 14. Bottom member 14 is configured to be connected to mounting ports 19 of battery 12. Mounting ports 19 serve the purpose of fixedly connecting bottom member 14 to battery 12. Usually, mounting ports 19 are predefined by a supplier of battery 12. Thus, the position of mounting ports 19 is usually fixed by the supplier of battery 12. Mounting ports 19 are only shown schematically in FIG. 1.

Battery connection device 10 further includes a top member 20. Top member 20 can be, for example, made from die casted aluminum. Top member 20 is connected to side wall 18 of bottom member 14 and covers bottom member 14 from on top so that top member 20 and bottom member 14 together form a box-like enclosure 22 for accommodating certain components of battery connection device 10 such as electronic components of battery connection device 10. As can be seen in FIG. 1 and as can be seen in more detail in FIG. 2, bottom wall 16 further includes a through-hole 24 extending through bottom wall 16.

Still referring to FIG. 1, battery connection device 10 further includes an adapter member 26. Adapter member 26 is arranged inside box-like enclosure 22 and extends at least partially through through-hole 24 towards battery 12. Adapter member 26 is configured to connect to battery 12, in particular to battery ports 27 of battery 12. Usually, battery 12 includes at least two battery ports 27. However, due to the schematic cross-sectional view, FIG. 1 depicts only one battery port 27. As is the case with mounting ports 19, also battery ports 27 are predefined from the supplier of battery 12. Thus, a position of battery ports 27 is usually fixed. Battery ports 27 of battery 12 may vary depending on the make and model of battery 12, which is why in FIG. 1 battery ports 27 are only shown schematically.

Due to manufacturing processes and/or tolerances during manufacturing of battery 12 the position of mounting ports 19 may vary relative to the position of battery ports 27. This positional variation between mounting ports 19 and battery ports 27, however, creates some difficulty upon mounting battery connection device 10 to battery 12. The reason for this is that especially bottom member 14 is made from a rigid material and therefore is not able to compensate the positional variation between mounting ports 19 and battery ports 27. In order to not cause any unnecessary mechanical stress to connection parts of battery connection device 10, battery connection device 10 allows for some relative movement between bottom wall 14 and adapter member 26 compensating the positional variation between mounting ports 19 and battery ports 27, as will be explained in connection with FIG. 2.

Figure 2:
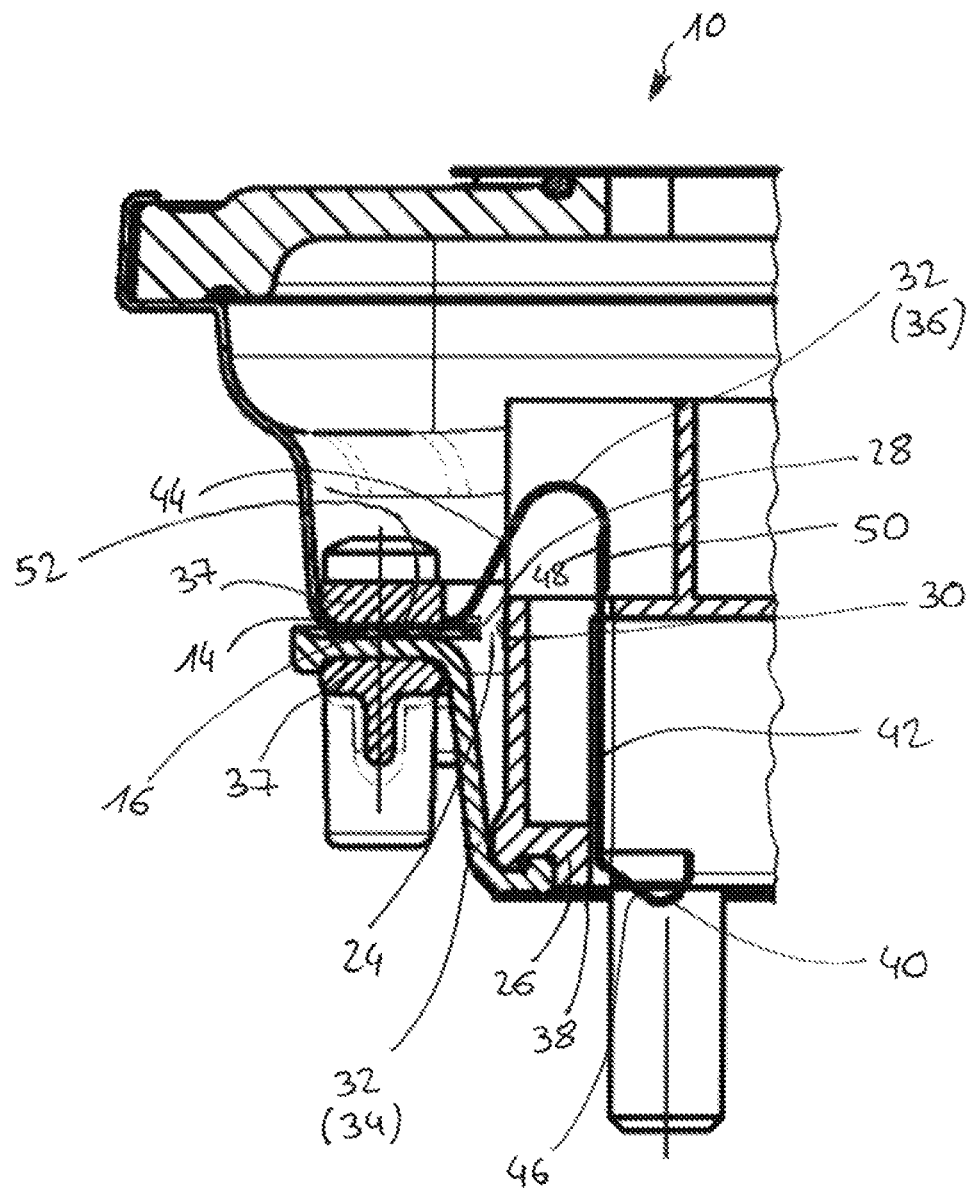
FIG. 2 is a schematic cross-sectional detailed view of the battery connection device of FIG. 1. Within this disclosure, the same reference numerals refer to the same components.

Referring now to FIG. 2, a detailed cross-sectional view of battery connection device 10 of FIG. 1 is shown.

As can be seen, bottom member 14 includes through-hole 24 extending through bottom wall 16. Through-hole 24 includes a circumferential face 28. A dimension of through-hole 24 is adjusted such that it is larger than a dimension of adapter member 26. As a result of which, an outer face 30 of adapter member 26 facing circumferential face 28 of through-hole 24 is not in contact with circumferential face 28. In other words, there is a gap between circumferential face 28 and outer face 30. This gap allows for movement of adapter member 26 relative to bottom member 14, and vice versa. Movement may be in all three dimensions. As bottom member 14 is configured to be connected to mounting ports 19 and as adapter member 26 is configured to be connected to battery ports 27 of battery 12, a positional variation between mounting ports 19 and battery ports 27 can be compensated by the relative movement between adapter member 26 and bottom member 14.

In order to prevent dust and/or moisture entering the inside of battery connection device 10, the gap between circumferential face 28 and outer face 30 is closed by a flexible connection member 32. Flexible connection member 32 includes a flexibility that allows for the relative movement between adapter member 26 and bottom member 14. Flexible connection member 32 also includes a sealing function to prevent dust and/or moisture entering the inside or enclosure 22 of battery connection device 10. In addition, flexible connection member 32 includes an electromagnetic shielding function that prevents electromagnetic radiation from leaving and/or entering enclosure 22 via the gap.

In the particular embodiment shown in FIG. 2, flexible connection member 32 comprises a sealing member 34 and a shielding member 36. Sealing member 34 is made of a rubber material and provides the sealing function. Shielding member 36 is made of a conductive material and provides the electromagnetic shielding function.

In the embodiment shown in FIG. 2, sealing member 34 is a rubber bellows sealing. One end of sealing member 34 is connected to a bottom side 38 of adapter member 26, the other end of sealing member 34 is connected to bottom wall 16 of bottom member 14. Likewise, one end of shielding member 36 is connected to bottom side 38 of adapter member 26, the other end of shielding member 36 is connected to bottom wall 16 of bottom member 14. Sealing member 34 and shielding member 36 are both connected to bottom wall 16 of bottom member 14 using a plastic clamp 37. Plastic clamp 37 ensures a good sealing function without hampering the shielding function.

As can be further seen in FIG. 2, shielding member 36 includes an S-like shape. The S-like shape allows for the relative movement between adapter member 26 and bottom wall 14. As can be further seen, shielding member 36 protrudes from bottom side 38 towards battery 12 and includes a spring-like protrusion 40. Spring-like protrusion 40 ensures that upon connection of adapter member 26 with battery 12, a conductive connection between shielding member 36 and battery 12 is achieved. As a result of which, a conductive connection between bottom member 14 and battery 12 is achieved providing a proper electromagnetic shield against electromagnetic radiation entering and/or leaving via the gap.

In the particular embodiment shown in FIG. 2, shielding member 36 includes a stamped copper part 42 and a braided copper part 44 connected to stamped copper part 42. Stamped copper part 42 also includes spring-like protrusion 40 and is made of copper sheet material. Copper sheet material may not be flexible enough to allow for the relative movement between adapter member 26 and bottom member 14 which is why in order to close the gap while, at the same time, ensuring the relative movement between adapter member 26 and bottom member 14, shielding member 36 includes braided copper part 44.

In more detail, a first end 46 of stamped copper part 42 is connected to bottom side 38 and includes spring-like protrusion 40. A second end 48 of stamped copper part 42 is connected to a first end 50 of braided copper part 44. A second end 52 of braided copper part 44 is connected to bottom wall 16 of bottom member 14. Second end 52 of braided copper part 44 and sealing member 34 are then clamped to bottom wall 16 of bottom member 14 using plastic clamp 37.

Battery connection device 10 as explained in connection with FIGS. 1 and 2 provides for an easy and reliable connection with battery 12 and at the same time compensates any positional variation between mounting ports 19 and battery ports 27 of battery 12 using the gap between circumferential face 28 and outer face 30 for relative movement between adapter member 26 and bottom member 14.

The invention claimed is:

1. A battery connection device configured to be connected to a battery of a vehicle, the battery connection device comprising:

a top member;

a bottom member having a side wall and a bottom wall connected to the side wall, the side wall being connected to the top member such that the top member and the bottom member form a box-like enclosure, the bottom wall further including a through-hole with a circumferential face;

an adapter member arranged inside the box-like enclosure and extending at least partially through the through-hole for connection with the battery, wherein a dimension of the adapter member is smaller than a dimension of the through-hole such that a gap is formed between an outer face of the adapter member facing the circumferential face and the circumferential face; and a flexible connection member connected to the adapter member and to the bottom member and closing the gap between the outer face and the circumferential face, wherein the flexible connection member includes an electromagnetic shielding function for shielding electromagnetic radiation and a sealing function for sealing the gap against dust and/or moisture.

2. The battery connection device of claim 1, wherein the flexible connection member further includes:

a sealing member made of rubber material for providing the sealing function; and a shielding member made of conductive material for providing the electromagnetic shielding function.

3. The battery connection device of claim 2, wherein the sealing member and the shielding member are both connected to the bottom wall of the bottom member and to a bottom side of the adapter member.

4. The battery connection device of claim 3, wherein the shielding member protrudes from the bottom side of the adapter member towards the battery.

5. The battery connection device of claim 3, wherein the sealing member and the shielding member are connected to the bottom wall using a plastic clamp.

6. The battery connection device of claim 3, wherein the shielding member includes a stamped copper part and a braided copper part connected to the stamped copper part.

7. The battery connection device of claim 6, wherein a first end of the stamped copper part is connected to the bottom side (38) of the adapter member, a second end of the stamped copper part is connected to a first end of the braided copper part, and a second end of the braided copper part is connected to the bottom wall (16) of the bottom member.

8. The battery connection device of claim 4, wherein the sealing member and the shielding member are connected to the bottom wall using a plastic clamp.

9. The battery connection device of claim 4, wherein the shielding member includes a stamped copper part and a braided copper part connected to the stamped copper part.

10. The battery connection device of claim 5, wherein the shielding member includes a stamped copper part and a braided copper part connected to the stamped copper part.

* * * * *